United States Patent [19]

Lisco

[11] Patent Number: 4,500,844
[45] Date of Patent: Feb. 19, 1985

[54] RINGING SIGNAL GENERATOR EMPLOYING DELTA-MODULATION POWER AMPLIFICATION TECHNIQUES

[75] Inventor: Richard J. Lisco, Whippany, N.J.

[73] Assignee: AT&T Bell Laboratories, Murray Hill, N.J.

[21] Appl. No.: 496,559

[22] Filed: May 20, 1983

[51] Int. Cl.³ .............................................. H03F 3/38
[52] U.S. Cl. .................................. 330/10; 179/18 HB
[58] Field of Search ...................... 330/10; 332/11 D; 179/17 E, 18 HB, 51 AA; 375/27, 28, 30, 33

[56] References Cited

U.S. PATENT DOCUMENTS

| 3,859,597 | 1/1975 | Zwaal | 332/11 D X |
|---|---|---|---|
| 4,090,136 | 5/1978 | Magnien et al. | 332/11 D X |
| 4,174,467 | 11/1979 | Ferrieu | 179/18 HB |
| 4,220,826 | 9/1980 | Kiss | 179/51 AA |
| 4,239,935 | 12/1980 | Bosik et al. | 179/84 R |
| 4,340,785 | 7/1982 | Awadalla | 179/51 AA |
| 4,349,703 | 9/1982 | Chea, Jr. | 179/18 HB |

Primary Examiner—James B. Mullins
Attorney, Agent, or Firm—Charles Scott Phelan

[57] ABSTRACT

A ringing signal generator is disclosed in which a low-level reference ringing signal, generated by a reference waveform generator (101), is amplified by a delta-modulation power amplifier (106, 108). The low-level reference signal is digitally encoded using delta-modulation techniques to generate a high-level digital signal. The high-level digital signal is filtered (421) to remove the high-frequency components therefrom and to decode the digital signal to form the high-level ringing signal that has the same shape and frequency as the reference signal. The delta-modulation power amplifier generates the ringing signal by comparing (401) the reference ringing signal ($E_i$) with an analog feedback signal ($E_f$) reconstructed from the high-level digital signal. The resultant binary error signal ($E_e$), representing the polarity of the difference between the reference and the feedback signals, is applied to a logic circuit (405) which samples the error signal at a clock rate substantially higher than the frequency of the ringing signal, and generates two binary control signals ($+SW$, $-SW$) based upon the error signal at multiple clock instants. These control signals open and close the switching elements (411, 412, 413, 414) in a bridge switch (410) to generate the high-level digital signal.

23 Claims, 7 Drawing Figures

RINGING SIGNAL GENERATOR EMPLOYING DELTA-MODULATION POWER AMPLIFICATION TECHNIQUES

BACKGROUND OF THE INVENTION

This invention relates to ringing signal generators for telephone systems and, more particularly, to a ringing signal generator for a subscriber loop carrier system which generates the high-level ringing signal by amplifying a low-level reference ringing signal.

It has become increasingly common to utilize carrier techniques to establish communication paths between a telephone central office and a plurality of remotely located telephone subscribers. Where such systems were, at one time, economically justifiable only for extremely long rural routes, today, due to the rapidly decreasing costs of integrated micro-electronics, such systems are becoming economically feasible for shorter and shorter subscriber loops.

In a subscriber loop carrier system, a plurality of voice channels are derived on one or two pairs of wire conductors by using analog carrier frequency division techniques, or by using time division digital techniques. In either case, the metallic connection previously used for transmitting subscriber ringing signals to the subscriber location can no longer be used for this purpose. It has, therefore, become necessary to generate ringing signals at the remote terminal of the carrier system and to control the generation and application of these ringing signals by supervisory information transmitted over the carrier-derived channels.

Since remote ringing signal generators serve a relatively small number of subscribers and are housed at the remote location, it is desirable that such ringing signal generators be small, inexpensive, compact, and require little power. The latter desirable characteristic is necessary to minimize battery back-up requirements. One way to generate high-level ringing signals is to linearly amplify at the remote terminal a low-level reference ringing signal, which has the desired signal shape and frequency characteristics of the ringing signal to be applied to the subscriber loop. Standard linear amplification techniques, however, are not power-efficient. Therefore, standard amplifier circuitry does not meet the aforenoted requirements for remote terminal equipment.

SUMMARY OF THE INVENTION

In accordance with the present invention, a high-level ringing signal is generated by linearly amplifying a low-level reference ringing signal using delta-modulation power amplification techniques. In particular, a low-level reference ringing signal is digitally encoded using delta-modulation techniques to generate a high-level digital signal. The high-level digital signal is filtered, which both removes the high-frequency components therefrom, and decodes the digital signal to form a high-level ringing signal that has the same shape and frequency as the reference signal, and which can be applied directly to the subscriber loop. The delta-modulation power amplifier generates the high-level ringing signal by comparing the reference ringing signal with an analog feedback signal reconstructed from the high-level digital signal. The resultant binary error signal, representing the polarity of the difference between the reference ringing signal and the feedback signal, is applied to a logic circuit which samples the error signal at a clock rate substantially higher than the frequency of the ringing signal, and generates two binary control signals based upon the error signal at multiple clock instants. The control signals open and close the switching elements in a bridge switch to generate the high-level digital signal which, at each clock instant, is either a high positive DC voltage, a high negative DC voltage, or a zero voltage. Advantageously, to prevent cross-current conduction in the bridge switch, the output of the switch is maintained at zero for a controlled dead zone period between each high positive DC voltage output and each negative DC voltage output.

DETAILED DESCRIPTION

In response to a control signal from the central office, a ringing signal generated at the remote terminal in a subscriber loop carrier system is applied to the subscriber line to be rung. Typically, the ringing signal is a low-frequency (e.g., 20 Hz), quasi-sinusoidal, high-level signal (e.g., 240 volts peak-to-peak) having a negative DC voltage offset (e.g., −48 volts). In those situations in which one subscriber loop must service two individual subscribers, the individual subscriber is signaled by applying to the loop a ringing signal having either a negative DC voltage offset or a positive DC voltage offset. In the embodiment of the present invention described hereinbelow, both a positive ringing signal and a negative ringing signal are both individually and simultaneously generated, enabling this ringing generator to be employed in those shared subscriber loop situations.

Figure 1:
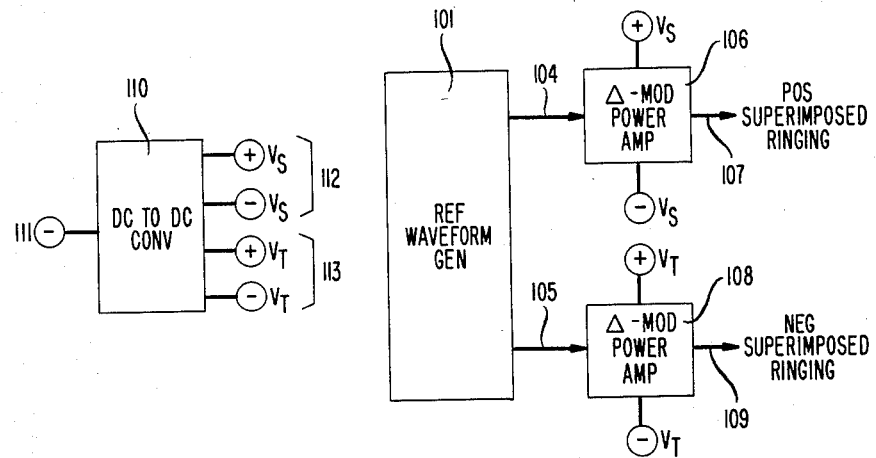
FIG. 1 is a block diagram of the ringing signal generator of the present invention that shows a reference waveform generator connected to two delta-modulation power amplifiers for producing two simultaneous ringing signals.

With reference to FIG. 1, reference waveform generator 101 generates a low-level positive ringing reference signal on lead 104, and a low-level negative ringing reference signal on lead 105. The positive ringing reference signal on lead 104 is a low-level quasi-sinusoidal signal (e.g., 3.2 volts, peak-to-peak) having a positive DC voltage offset (e.g., 0.64 volts). Similarly, the negative ringing reference signal on lead 105 is a low-level quasi-sinusoidal signal (e.g., 3.2 volts, peak-to-peak) having a negative DC voltage offset (e.g., −0.64 volts). Delta-modulation power amplifier 106 amplifies (e.g., by an amplification factor of 75) the positive ringing reference signal to produce a high-level ringing signal (e.g., 240 volts, peak-to-peak) having a positive DC voltage offset (e.g., 48 volts) on lead 107. Similarly, delta-modulation power amplifier 108 amplifies the negative ringing reference signal to produce a high-level ringing signal (e.g., 240 volts, peak-to-peak) having a negative DC voltage offset (e.g., −48 volts) on lead 109.

As will be discussed hereinafter in connection with the description of the delta-modulation power amplifier, a high DC voltage (e.g., 200 volts) is required across each amplifiers. The DC voltages $V_S$ and $V_T$, applied to amplifiers 106 and 108, respectively, are derived from a conventional DC-to-DC converter 110 which converts a negative source of potential 111 to two high-voltage sources 112 and 113. Each source includes a positive supply lead and negative return lead, which are connected across the associated amplifier.

Figure 2:
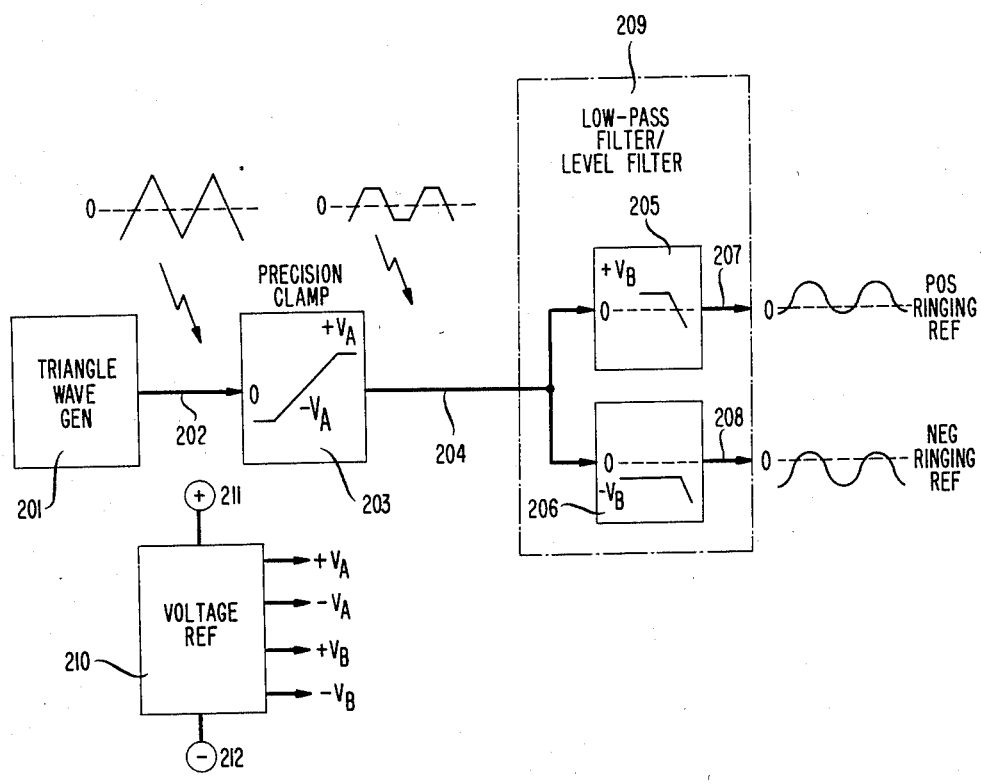
FIG. 2 is a block diagram of the reference waveform generator in FIG. 1.

With reference to FIG. 2, the AC portions of the positive and negative ringing reference signals are derived from a triangle wave generator 201. Triangle wave generator 201 produces on lead 202 a triangular wave having a frequency equal to the frequency of the ringing signals to be generated. A precision clamp 203 converts the triangular waveform on lead 202 to a trapezoidal waveform on lead 204 by limiting the maximum and minimum output signal values to $+V_A$ and $-V_A$, respectively, where $\pm V_A$ are precision voltages derived from voltage reference circuit 210. A low-pass filter/level-shifter circuit 209 network includes two subcircuits 205 and 206 which filter the high-frequency components from the trapezoidal signal, and provide positive and negative DC voltage offsets, respectively. The positive and negative voltage offsets are determined by precision voltages $+V_B$ and $-V_B$, also generated by voltage reference circuit 210. The outputs of low-pass filter/level-shifter circuit 209 are low-level quasi-sinusoidal signals having positive and negative voltage offsets.

Figure 3:
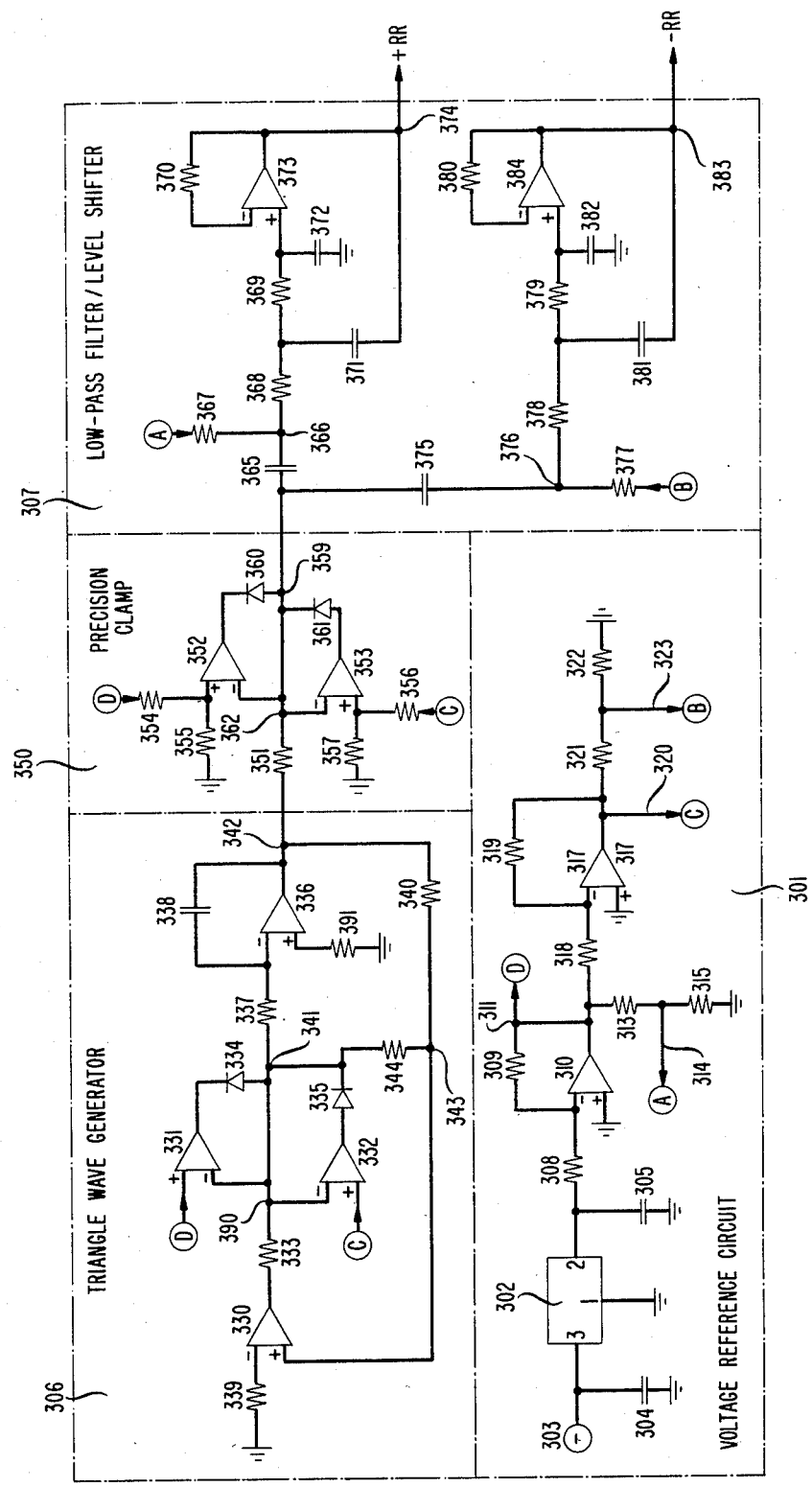
FIG. 3 is a schematic diagram of the reference waveform generator in FIG. 2.

With reference to the schematic diagram of the reference waveform generator in FIG. 3, voltage reference circuit 301 derives four precision DC voltages A, B, C, and D from a nonprecision negative DC voltage source 303 and a standard and commonly available precision voltage regulator 302. Regulator 302 converts the negative potential at terminal 3 to a precise voltage at terminal 2 having a deviation of ±0.01%. Both terminals 3 and 2 of regulator 302 are capacitively coupled to ground through capacitors 304 and 305, respectively. The four precision reference voltages A, B, C, and D are derived from the voltage at terminal 2 of the regulator, and supplied to the triangle wave generator 306, precision clamp 350, and low-pass filter/level-shifter 307. By employing precision voltages, which are stable with time and temperature, the derived low-level reference ringing signals are also precise and stable with time and temperature, thereby enabling the frequency and amplitude of the ringing signals to be accurately maintained.

The output of regulator 302 is supplied to an inverting DC-coupled amplifier consisting of resistor 308, resistor 309, and operational amplifier 310. The output voltage D on lead 311 is a positive voltage equal to the negative of the product of the voltage at terminal 2 of regulator 302 and the ratio between resistors 309 and 308. Voltage A is derived from voltage D by means of a resistive voltage divider consisting of resistors 313 and 315. A second inverting DC-coupled amplifier, consisting of operational amplifier 317 and equal resistors 318 and 319, inverts voltage D to produce the negative voltage C on lead 320. A voltage divider, consisting of resistors 321 and 322, produces voltage B, equal to −A, on lead 323.

Triangle wave generator 306 has a conventional feedback oscillator configuration. The generator includes: an operational amplifier comparator 330; a precision clamp, which consists of operational amplifiers 331 and 332, resistor 333, and diodes 334 and 335; and an integrator, which consists of operational amplifier 336, resistor 337, and capacitor 338. The output of operational amplifier 336 is connected through resistor 340 to the "+" input of operational amplifier 330. When this "+" input of comparator 330 is negative, the output is also negative, which is limited in magnitude at node 390 to the negative reference voltage C at the "+" input of amplifier 332. A negative voltage step at input node 341 of the integrator induces at node 342, at the output of the integrator, a positively rising ramp signal. The negative step at node 341 also induces a negative step at node 343, which is interconnected to node 341 through resistor 344. The integrator output voltage linearly increases until the potential at node 343 and at the "+" input of amplifier 330 is positive, which thereupon effects a polarity change at the output of amplifier 330. This polarity change produces a step change in the polarity of node 341 which changes the integrator output signal to a negatively decreasing ramp. The cycle is repeated when the polarity of node 343 is again reversed. Resistors 340 and 344 determine the maximum and minimum amplitudes of the triangular output signal. The frequency is determined by resistor 337 and capacitor 338. A resistor 339, connected between ground and the "−" input of amplifier 330, and a resistor 391, connected between ground and the "+" input of amplifier 336, balance the offset voltages produced by the input bias currents of the respective amplifiers.

The clamp maintains node 341 at either the positive reference voltage D or the negative reference voltage C (equal to −D) which, as aforenoted, are precision voltages. Such a precision voltage at the integrator input is required to precisely control the frequency of the triangular wave output, which is required if the frequency of the ringing signals developed therefrom are to be within desired tolerances.

The clamp functions as follows: Operational amplifier 330 is designed so that the positive and negative outputs thereof are more positive and more negative, respectively, than the positive reference voltage D and the negative reference voltage C. When the "−" input of operational amplifier 332 is more negative than reference voltage C, then the output of amplifier 332 is positive, which forward biases diode 335, and forces the gain of amplifier 332 to be zero for any voltage at the "−" input more negative than the negative reference voltage. Therefore, the potential at node 341 is held to negative voltage C at the "+" input of amplifier 332. Simultaneously therewith, the output of amplifier 331 is positive, which keeps diode 334 reverse-biased, which isolates the output of amplifier 331 from node 341. When the output of amplifier 330 is positive, node 341 is similarly clamped by amplifier 331 and diode 334 to positive voltage D at the "+" input of amplifier 331. Also simultaneously therewith, diode 335 is reverse-biased, isolating the output of amplifier 332 from node 341.

The output 342 of triangle wave generator 306 is connected to a precision clamp 350, which converts the triangular waveform into a trapezoidal signal having the same frequency as the triangular wave. Node 342 is connected through a resistor 351 to the "−" inputs of operational amplifiers 352 and 353. The positive reference voltage D is connected through resistor 354 to the "+" input of amplifier 352, which is also connected to ground through resistor 355. The negative reference voltage C is connected through resistor 356 to the "+" input of amplifier 353, which is also connected to ground through resistor 357. Output node 359 is connected through diode 360 to the output of amplifier 352, and through diode 361 to the output of amplifier 353. Since neither diode 360 nor diode 361 conducts when the voltage at node 362 is between the positive voltage at the "+" input of amplifier 352 and the negative voltage at the "+" input voltage of amplifier 353, the output voltage at node 359 equals the voltage at node 342. When the voltage at node 362 exceeds the voltage at the "+" input of amplifier 352, the output of amplifier 352 becomes negative, which forward-biases diode 360, and forces the gain of amplifier 352 to zero for any voltage at the "−" input greater than voltage at the "+" input. The voltage at node 359 is therefore maintained at the reference voltage at the "+" input of amplifier 352. Similarly, amplifier 353 and diode 361 maintain node 359 at the reference voltage at the "+" input of amplifier 353 for any input that is more negative than that reference voltage. The maxima and minima of the triangular wave at node 342 are therefore clipped by clamp 350 to produce a trapezoidal wave at node 359.

The trapezoidal signal at node 359 is applied to low-pass filter/level-shifter 307. The signal at node 359 is AC-coupled through capacitor 365 to node 366. Positive reference voltage A is also coupled through a resistor 367 to the node 366 to produce a trapezoidal signal having a positive DC offset. The resultant signal is coupled through a conventional low-pass filter circuit that consists of resistors 368, 369, and 370; capacitors 371 and 372; and operational amplifier 373. This conventional two-pole filter removes the high-frequency components from the trapezoidal signal at node 366 and produces a smooth quasi-sinusoidal signal having a positive DC offset at node 374.

In a similar manner, the signal at node 359 is AC-coupled through capacitor 375 to node 376. Also, negative reference voltage B is coupled to node 376 through resistor 377 to produce a trapezoidal signal having a negative DC offset. The low-pass filter consisting of resistors 378, 379, and 380; capacitors 381 and 382; and operational amplifier 384 is a conventional two-pole filter, which produces a quasi-sinusoidal signal having a negative DC offset at node 383.

The two quasi-sinusoidal low-level signals at nodes 374 and 383 are the positive and negative reference ringing signals RR and −RR, respectively, which are linearly amplified to produce the high-voltage ringing signals that can be applied directly to the telephone line at the central office or at the remote terminal of a subscriber loop carrier system.

In accordance with the present invention, each reference ringing signal is amplified by a delta-modulation power amplifier. As noted in FIG. 1, each reference ringing signal is amplified by a separate delta-modulation amplifier. These delta-modulation power amplifiers employ delta-modulation encoding and decoding techniques to achieve signal amplification. Essentially, delta-modulation encoding, as practiced in the digital encoding/decoding art, is a single-bit encoding scheme in which an input analog signal to be digitally transmitted is encoded into a bit stream in which each bit represents the polarity, at a sampling instant, of a difference signal. The difference signal is obtained by comparing the input analog signal with a prediction signal based upon past samples, and the sampling rate is at least twice the frequency of the input signal. Since transmitting the difference signal is approximately equal to sending the signal derivative, decoding the transmitted bit stream is implemented by integrating the transmitted pulses. Similarly, at the transmitter, the prediction signal is derived by integrating the pulses in the bit stream.

The principles of delta-modulation encoding are incorporated in the delta-modulation power amplifier described herein. As will be described in detail hereinbelow, the low-level ringing reference signal is encoded by comparing the magnitude of the input reference signal with a feedback signal to generate a binary error signal which, at any instant, represents the polarity of the difference between the two signals. The error signal is applied to a logic circuit which samples the error signal at a frequency substantially greater than the frequency of the ringing signal, and generates two binary control signals, the logic states of which are derived from the sampled error signal at multiple sampling instants. These control signals control a bridge switch which generates a high-voltage digital output signal having, at any given instant, a positive DC voltage, a negative DC voltage, or a zero voltage. The feedback signal is derived by integrating and attenuating the high-voltage digital output signal. By filtering the high-voltage digital signal, the signal is decoded; and the high-frequency components are removed therefrom, thereby producing the analog high-voltage ringing signal as linearly amplified from the low-level ringing reference signal.

Figure 4:
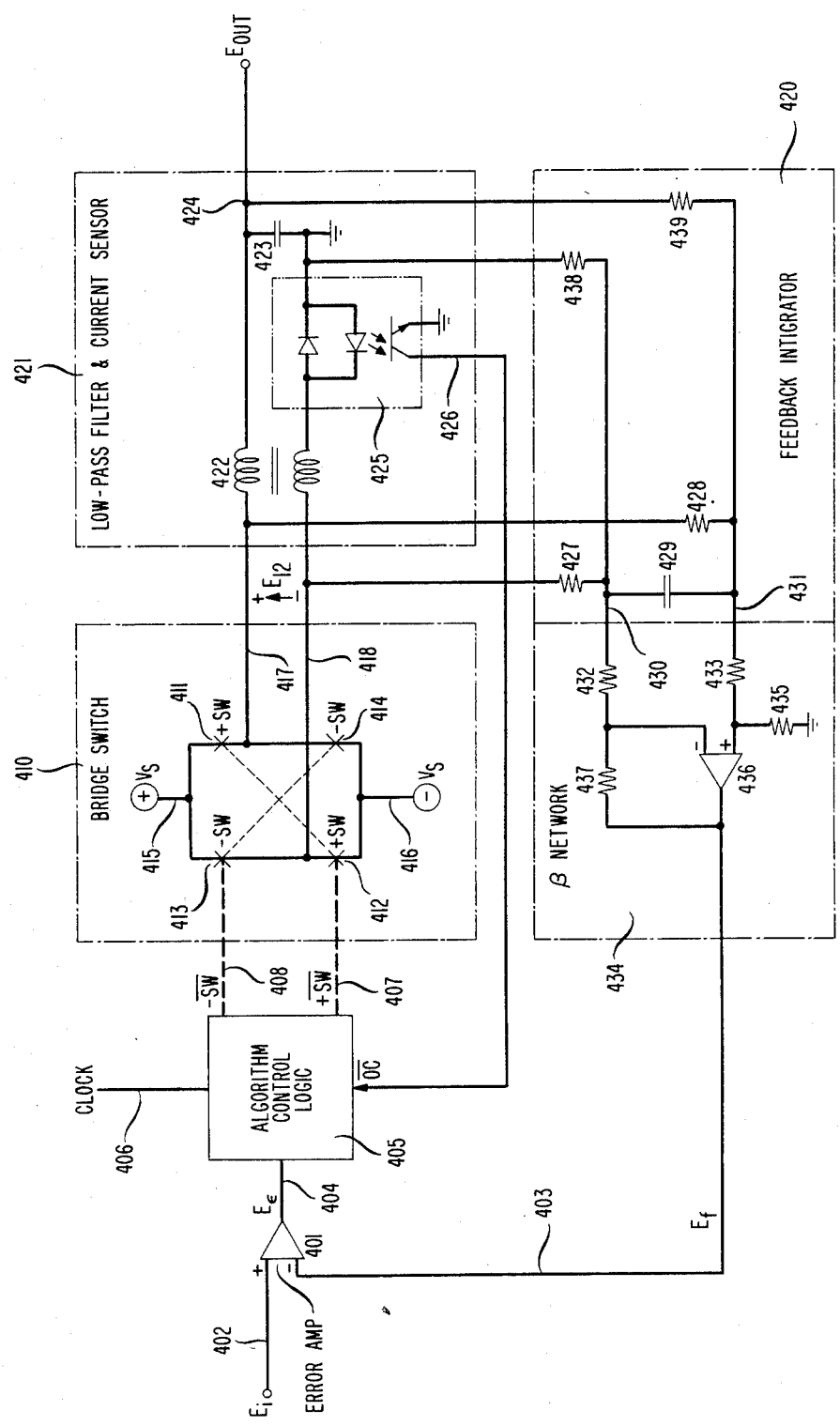
FIG. 4 is a diagram of the delta-modulation power amplifier in FIG. 1.

The delta-modulation power amplifier in accordance with the present invention is described with reference to FIG. 4. The delta-modulation power amplifier includes a high-gain error amplifier 401, which compares the input signal $E_i$ on lead 402 (the low-level reference ringing signal) with a prediction signal $E_f$ on lead 403, which is a reconstructed version of the previous input signal derived from both the high-voltage digital output signal and the high-voltage analog output signal. Amplifier 401 generates a binary error signal $E_\epsilon$ on lead 404, which has a logic "1" voltage level when $E_i$ is greater than $E_f$, and a logical "0" voltage level when $E_f$ is greater than $E_i$. The error signal $E_\epsilon$ thus represents the polarity of the difference between $E_i$ and $E_f$. The binary $E_\epsilon$ is inputted to algorithm control logic circuit 405 on lead 404. The binary error signal is sampled by algorithm control logic circuit 405 in response to a clock signal on lead 406. Algorithm control logic circuit 405 has two output leads 407 and 408, upon which binary control signals $\overline{+SW}$ and $\overline{-SW}$, respectively, are generated.

The logic circuit 405 output leads 407 and 408 are connected to a bridge switch 410. Bridge switch 410 includes switching elements 411, 412, 413, and 414. A high-level DC voltage source $V_S$ is connected across the switch to nodes 415 and 416. This high-voltage source is derived from DC-to-DC converter 110 described hereinabove in connection with FIG. 1. Switch output lead 417 is connected between switch elements 411 and 414, and switch output lead 418 is connected between switch elements 412 and 413. Switching elements 411 and 414 are mutually controlled by binary control signal $\mp \overline{SW}$ on lead 407, and switching elements 413 and 412 are mutually controlled by binary control signal $\overline{-SW}$ on lead 408. In response to a logical "0" on lead 407, switching elements 411 and 412 are closed; and the voltage $E_{12}$, across leads 418 and 417, is $+V_S$. Similarly, a logical "0" on lead 408 closes switching elements 413 and 414, which places a voltage $-V_S$ across leads 418 and 417. When $\overline{+SW}$ and $\overline{-SW}$ are both logical "1's", all switching elements are opened, and $E_{12}$ is zero. Algorithm control logic circuit 405 prevents the simultaneous occurrence of logical "0's" on leads 407 and 408, which prevents the simultaneous closure of switching elements 411, 412, 413, and 414, which would short-out the high-voltage power supply $V_S$, connected across the switch.

Algorithm control logic circuit 405 converts the input bit stream on lead 404 to control signals $\overline{+SW}$ and $\overline{-SW}$ which depend upon the concentration of "1's" and "0's" in the sampled bit stream. If $\overline{-SW}$ is a logical "0", and switching element 413 and 414 are closed, four consecutive "1's" must be detected in the sampled bit stream before $\overline{+SW}$ switches to a logical "0" state to close switching elements 411 and 412. Similarly, a $\overline{+SW}$ logical "0" state must be followed by four consecutive "0's" before $\overline{-SW}$ switches to a logical "0" to close switching elements 413 and 414. During the interval between a $\overline{+SW}$ logical "0" and a $\overline{-SW}$ logical "0", switching elements 411, 412, 413, and 414 remain open. This fixed dead zone time period prevents cross-current conduction, which could otherwise be highly dissipative, and result in damage to the power supply or switch elements. The precisely defined dead zone ensures that the time between switch closures is longer than the storage time (turn-off delay) of the switch. The algorithm control logic circuit 405 will be discussed in detail hereinafter in connection with the description of its logic diagram in FIG. 5.

The voltage $E_{12}$ across leads 418 and 417 at the output of bridge switch 410 is a high-voltage, tri-level signal having discrete output levels $+V_S$, 0, and $-V_S$. This high-voltage digital representation of the error signal is applied to low-pass filter and current sensor circuit 421. The filter, which includes inductor 422 and capacitor 423, functions as a decoder to integrate $E_{12}$ and remove high-frequency components therefrom. The output signal $E_o$ between lead 424 and ground is an amplified replica of the input signal $E_i$, the reference ringing signal, and is the quasi-sinusoidal ringing signal that can be directly applied to the telephone line.

A current sensor 425 senses the output current and, in response to an output current above a predetermined level, produces a signal on lead 426 that triggers algorithm control circuit 405 to immediately generate a logical "1" on leads 407 and 408 which opens switches 411, 412, 413, and 414. An excess amount of current is thus prevented from being drawn, which could damage the switching elements or the $V_S$ power supply.

The feedback signal $E_f$ is derived from both the high-level digital signal $E_{12}$ at the output of bridge switch 410 and the analog signal $E_o$ at the output of filter/sensor 421. Both of these signals are applied to feedback integrator 420, which includes resistors 427, 428, 438, and 439, and capacitor 429.

The main component of the feedback signal $E_f$ is derived from the digital signal $E_{12}$, which is integrated by resistors 427 and 428, and capacitor 429 to form a piecewise linear signal across leads 430 and 431. This high-voltage signal, which consists of a series of ramps that change slope direction only at the clock instants, is attenuated by $\beta$-network 434. The $\beta$-network 434 includes operational amplifier 436, equal resistors 432 and 433, and equal resistors 435 and 437. The $\beta$-network 434 attenuates the signal across leads 430 and 431 by a factor $\beta$ equal to the ratio of resistor 437 to resistor 432 ($\beta<1$), and performs balanced to single-ended conversion to provide feedback signal $E_f$ on lead 403. The feedback signal $E_f$ on lead 403 is therefore the reconstructed version of the input signal $E_i$ on lead 402.

An additional signal component to feedback signal $E_f$ is provided directly from the output signal $E_o$. A small portion of signal $E_o$ is integrated by resistors 438 and 439, and capacitor 429, and attenuated by $\beta$-network 434 to provide an additional component in signal $E_f$ that provides load regulation of the output signal $E_o$. The output $E_o$ can thus be maintained at a constant level as an additional load is connected across leads 424 and ground. The ringing signal $E_o$ can therefore ring a greater load (of plural parallel connected station sets) than would otherwise be possible absent the inclusion of the load regulation feedback control.

The voltage gain of the delta-modulation power amplifier between output signal $E_o$ and the input signal $E_i$ can be readily shown using standard feedback analysis to be approximately equal to $1/\beta$ when the forward loop provides an amplification factor substantially greater than one. As aforenoted, $\beta$ is determined solely by resistors 432, 433, 435, and 437. Therefore, the voltage gain of the power amplifier is controllable solely by stable passive elements, i.e., resistors. Therefore, the voltage $V_S$ across to bridge switch 410 need not be regulated to produce a regulated output voltage $E_o$; and variations in the supply $V_S$ will not affect the voltage gain of the delta-modulation amplifier.

Figure 5:
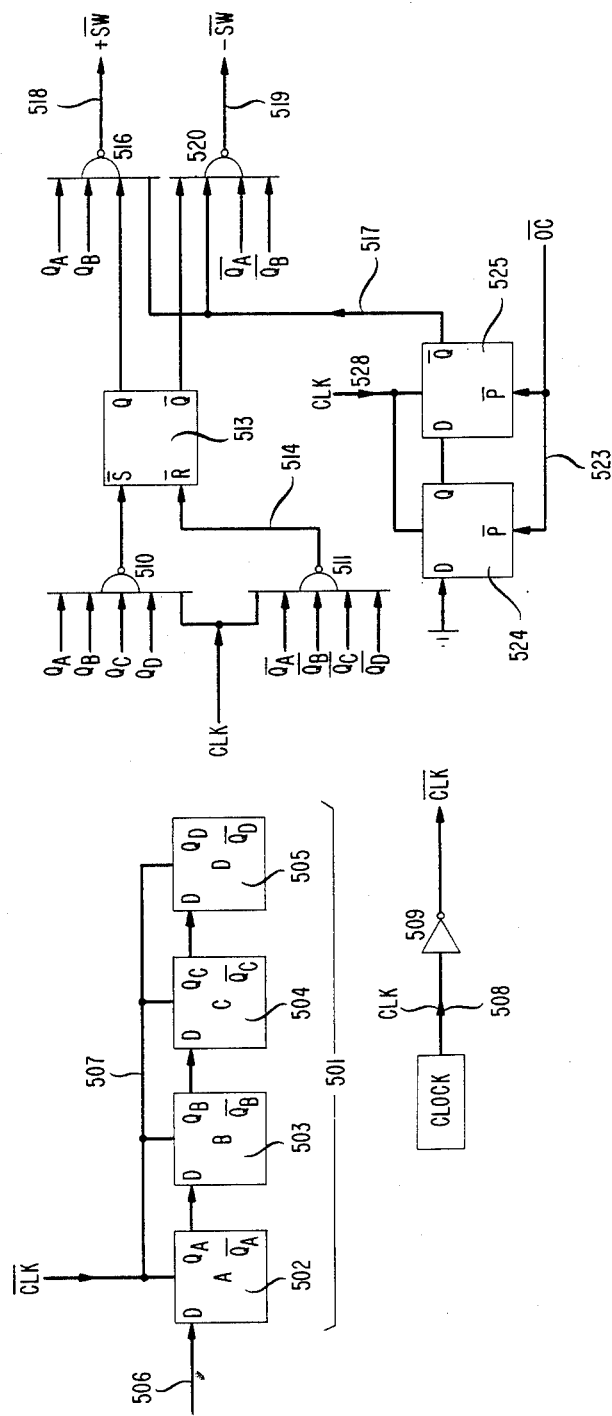
FIG. 5 is a logic diagram of the algorithm control logic circuit in FIG. 4.

The logic diagram of the algorithm control logic circuit 405 is shown in FIG. 5. As aforenoted, the algorithm control logic circuit determines the optimum operating mode of the high-voltage bridge switch 410 based on the concentration of "0's" and "1's" in the error signal. Logic circuit 410 generates the two control signals $\overline{+SW}$ and $\overline{-SW}$ based on the past and present value of the error signal. As noted hereinabove, four consecutive logical "1's" are required in the sampled error bit stream to generate a logical "0" on the $\overline{+SW}$ control signal to close the +SW switch elements 411 and 412. Similarly, four consecutive logical "0's" are required in the sampled error bit stream to generate a logical "0" on the $\overline{-SW}$ control signal to close the −SW switch elements 413 and 414. Therefore, at least four bits are required between the opening of one set of switches and the closing of the other set. As aforenoted, this well-controlled dead zone eases the switching speed requirements of the bridge switch, and eliminates the possibility of cross-current conduction. In addition, the algorithm control logic includes circuitry that prevents glitches from interfering with proper operation of the bridge switch, and circuitry that responds to an over-current signal on lead 428.

With reference to FIG. 5, a shift register 501, consisting of four D-type flip-flops 502, 503, 504 and 505, accepts the binary error signal on lead 506. In response to each clocking signal, the binary signal on lead 506 is shifted to the Q output of flip-flop 502; and, simultaneously therewith, the previous Q output of each flip-flop is shifted to the next adjacent flip-flop. The binary signal on lead 506 is thus sampled at the clocking rate, and the sampled bits are successively shifted through the shift registers. In particular, the sampled error signal is clocked through the shift register 501 in response to the rising edge of a clocking signal $\overline{CLK}$ on lead 507. Clock signal $\overline{CLK}$ is derived from the system clock signal CLK on lead 508, which has been inverted by inverter 509, and which has a frequency substantially higher than the frequency of the ringing signal. The logical states $Q_A$, $Q_B$, $Q_C$, and $Q_D$ of flip-flops 502 through 505, respectively, are the four most recent bits in the sampled error signal on lead 506.

The Q outputs $Q_A$, $Q_B$, $Q_C$, and $Q_D$ of flip-flops 502 through 505, respectively, and the CLK signal, form the inputs to NAND gate 510. Similarly, the $\overline{Q}$ outputs $\overline{Q_A}$, $\overline{Q_B}$, $\overline{Q_C}$, $\overline{Q_D}$ and the CLK signal form the inputs to NAND gate 511. Output lead 512 of NAND gate 510 is connected to the set $\overline{S}$ input, and output lead 514 of NAND gate 511 is connected to the reset $\overline{R}$ input of polarity flip-flop 513. When four consecutive "1's" are shifted through shift register 501, making $Q_A$, $Q_B$, $Q_C$, and $Q_D$ all logical "1's", the output of NAND gate 510 on lead 512 becomes a logical "0" (during a duration of a CLK pulse). This logical "0" triggers the $\overline{S}$ input of polarity flip-flop 513, and sets the Q output thereof at a logical "1" and the $\overline{Q}$ output at a logical "0". The Q output of polarity flip-flop 513 is connected by lead 515 to a first input of $\overline{+SW}$ NAND gate 516, the output of which, on lead 518, is the $\overline{+SW}$ control signal. $Q_A$ and $Q_B$ are connected to second and third inputs, and overcurrent logic lead 517 is connected to a forth input of NAND gate 516. For purposes of the immediate discussion, the logic state of lead 517 can be assumed to be "1". Therefore, the output of $\overline{+SW}$ NAND gate on lead 518 is a logical "0", which closes the +SW pair of switches in the bridge switch. The $\overline{-SW}$ control signal appears on lead 519 at the output of $\overline{-SW}$ NAND gate 520. The inputs of NAND gate 520 include the $\overline{Q}$ output of polarity flip-flop 513 on lead 521, the $\overline{Q_A}$ and $\overline{Q_B}$ outputs of flip-flops 502 and 503, and overcurrent logic lead 517. Since the $\overline{Q_A}$ and $\overline{Q_B}$ are logic "0's", the $\overline{-SW}$ output of NAND gate 520 is a logical "1", which keeps the −SW pair of switches open. It is readily apparent that, since the inputs to gates 516 and 520 are complementary, $\overline{+SW}$ and $\overline{-SW}$ cannot be logical "0's" simultaneously.

When a "0" bit follows a string of "1's", the $\overline{+SW}$ control signal switches to a logical "1". Not until four consecutive "0" bits are shifted through shift register 501, however, will all the inputs to NAND gate 511 be logical "1's" to reset polarity flip-flop 513. When polarity flip-flop 513 is reset, its Q output is reset to "0"; and its $\overline{Q}$ output is reset to "1". With $\overline{Q}$, $\overline{Q_A}$, $\overline{Q_B}$, and lead 517 now logical "1's", the output of NAND gate 520 is a logical "0", which closes the −SW pair of switches.

Once polarity flip-flop 513 is set and $\overline{+SW}$ is at the logical "0" state, a single "0" at $Q_A$ forces $\overline{+SW}$ to "1", which opens the +SW switches. If, however, before polarity flip-flop 513 gets reset (i.e., after one, two, or three consecutive "0's"), at least two consecutive "1's" are shifted through the shift register to make $Q_A$ and $Q_B$ logical "1's", the $\overline{+SW}$ output of NAND gate 516 returns to the logic "0" state, and the +SW pair of switches are reclosed. Similarly, once polarity flip-flop is reset, and $\overline{-SW}$ is at the logical "0" state, a single "0" at $\overline{A_A}$ forces $\overline{-SW}$ to "1", which opens the −SW switches. If, however, before polarity flip-flop 513 gets set (i.e., after one, two, or three consecutive "1's"), at least two consecutive "0's" are shifted through the shift register to make and $\overline{A_A}$ and $\overline{Q_B}$ logical "1's", the $\overline{-SW}$ output of NAND gate 520 returns to the logic "0" state, and the −SW pair of switches are reclosed.

As aforenoted, the algorithm control logic circuit includes circuitry to immediately switch $\overline{+SW}$ and $\overline{-SW}$ to the logical "1" state to open all switching elements in the bridge switch upon the detection by the current sensor of an overcurrent condition. An overcurrent control signal $\overline{OC}$ is generated by the current sensor and inputted to the logic control circuit over lead 523 to the preset $\overline{P}$ inputs of a pair of D-type flip-flops 524 and 525. The D input of flip-flop 524 is connected to ground potential, or equivalently, to the TTL voltage in the logic circuit that represents a logical "0". The Q output of flip-flop 524 is connected to the D input of flip-flop 525; and the $\overline{Q}$ output of flip-flop 525 is connected to lead 517 which is connected, as aforenoted, to inputs of NAND gates 516 and 520. During normal operating conditions, the $\overline{OC}$ control signal on lead 523 is a logical "1". When the $\overline{P}$ input is a logical "1", the Q output of flip-flop 524 (and the D input of flip-flop 525) is the logic "0" at its D input. In response to each clock pulse on lead 528, a logical "0" is clocked from the D input of flip-flop 525 to its Q output, thereby keeping its $\overline{Q}$ input a logical "1". When the current sensor detects an overcurrent condition, $\overline{OC}$ control signal switches to a logical "0", which immediately presets the Q output of flip-flop 524 (and D input of flip-flop 525) to a logical "1", and the $\overline{Q}$ output of flip-flop 525 to a logical "0". The logical "0" on lead 517 immediately forces the $\overline{+SW}$ and $\overline{-SW}$ control signals to logical "1's", and opens all switches. Lead 517 remains a logic "0" as long as the $\overline{OC}$ control signal is a logical "0". Once $\overline{OC}$ returns to its normal logic "1" state, and upon the leading edge on the next clock pulse on lead 528, the logical "1" at the D input of flip-flop 525 keeps its $\overline{Q}$ output (and thus lead 517) a logical "0". Also, the logical "0" at the D input of flip-flop 524 causes its Q output to become a logical "0". At the second clock pulse following the return of $\overline{OC}$ to the logical "1" state, the logical "0" D input of flip-flop 525 changes its $\overline{Q}$ output (and lead 517) back to the logical "1" state. Thus, following the conclusion of an over-current shutdown, the +SW and −SW switches remain open for two clock pulses.

Figure 6:
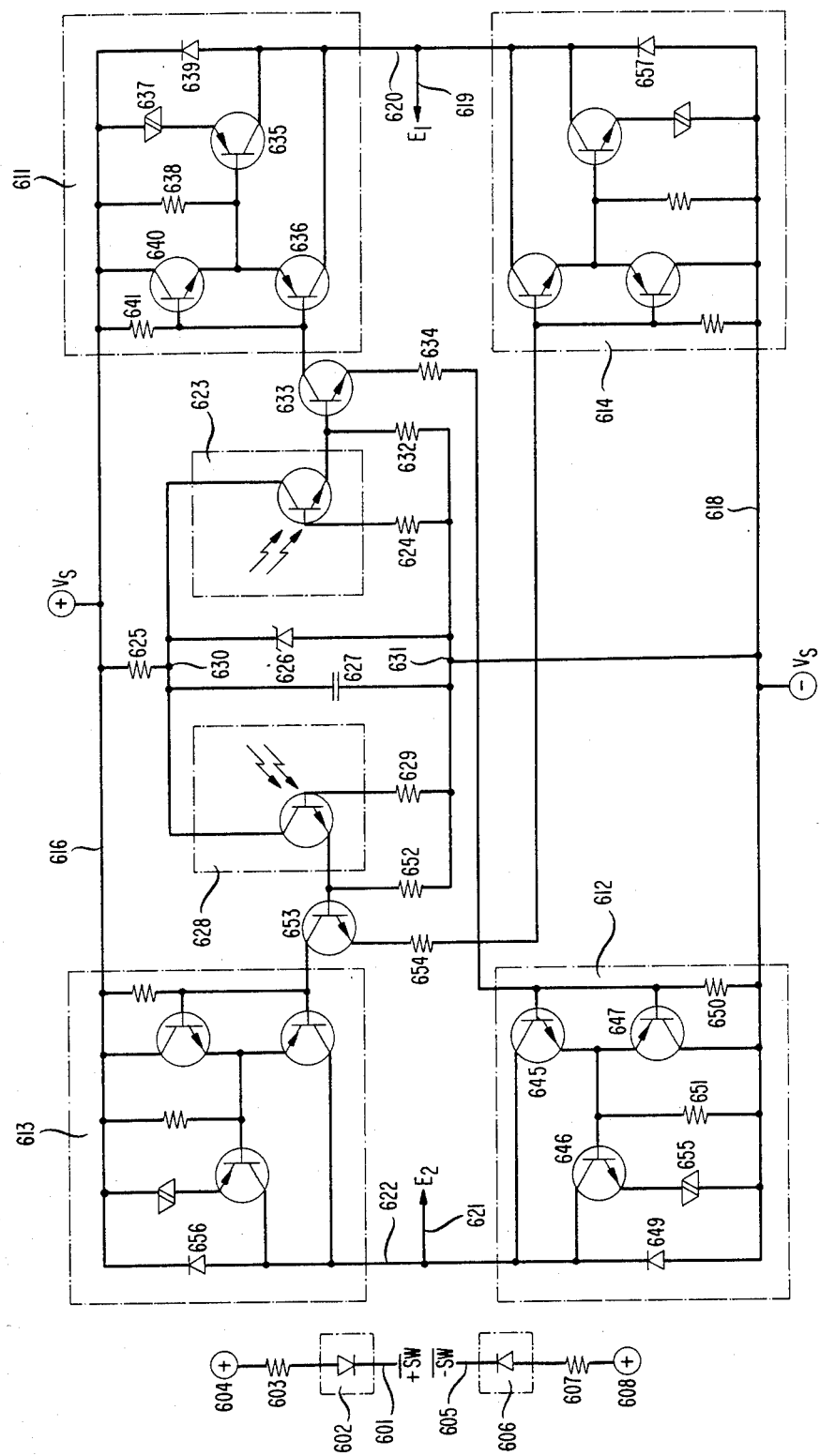
FIG. 6 is a schematic diagram of the bridge switch in FIG. 4.

With reference to the schematic diagram of the bridge switch in FIG. 6, the $\overline{+SW}$ control signal is applied via lead 601 to the cathode of an internal LED 602. The anode of LED 602 is connected through resistor 603 to a source of positive potential 604. The $\overline{-SW}$ control signal is similarly applied via lead 605 to the cathode of internal LED 606, the anode of which is connected through resistor 607 to a source of positive potential 608.

The bridge switch includes four switching subcircuits 611, 612, 613 and 614. Subcircuits 611 and 613 are connected by lead 616 to the positive high-voltage $+V_S$ supply, and subcircuits 612 and 614 are connected by lead 618 to the negative return $-V_S$ of the same high-voltage source. Subcircuits 611 and 614 are interconnected by lead 620, and subcircuits 612 and 613 interconnected by lead 622. The output voltage $E_{12}$ of the bridge switch is equal to the voltage difference $E_1-E_2$ of output nodes 619 and 621, respectively.

When switching subcircuits 611 and 612 are commonly closed, a direct path is established between the positive supply $+V_S$ and output node 619, and between the negative return $-V_S$ and output node 621. The output of the switch $E_{12}$ is thus equal to high-voltage supply voltage $+V_S$. Similarly, when switching subcircuits 613 and 614 are commonly closed, a direct path is established between the negative return $-V_S$ and output node 619, and between the positive supply $+V_S$ and output node 621. The output of the switch $E_{12}$ is thus equal to $-V_S$.

Switching subcircuits 611 and 613 are identical; and switching subcircuits 612 and 614 are identical, with subcircuits 612 and 614 being complementary to subcircuits 611 and 613. Subcircuit 611 includes pnp transistors 635 and 636, connected in a standard Darlington pair configuration, such that the base of transistor 635 is connected to the emitter of transistor 636, and the collectors of both transistors are interconnected. The emitter of transistor 635 is connected to the positive supply $+V_S$ through varistor 637. A resistor 638 is connected between the base of transistor 635 and $+V_S$. The collector of npn transistor 640 is also connected to $+V_S$; and the base of transistor 640 is connected to the base of transistor 636, and through resistor 641 to $+V_S$. The emitter of transistor 640 is connected to the base of transistor 635 and emitter of transistor 636. A diode 639 is connected between supply $+V_S$ and the collectors of transistors 635 and 636.

Subcircuit 612 includes npn transistors 645 and 646, connected in a standard Darlington pair configuration, such that the base of transistor 646 is connected to the emitter of transistor 645, and the collectors are interconnected. The emitter of transistor 646 is connected to the negative return $-V_S$ through varistor 655. Resistor 651 is connected between the base of transistor 646 and $-V_S$. The collector of pnp transistor 647 is connected to $-V_S$, and the emitter of transistor 647 is connected to the base of transistor 646 and emitter of transistor 645. The base of transistor 645 and the base of transistor 647 are connected through resistor 650 to $-V_S$. A diode 649 is connected between return $-V_S$ and the collectors of transistors 645 and 646.

Switching subcircuits 611 and 612 are commonly opened and closed in response to the logic state of the $\overline{+SW}$ control signal on lead 601. Switching subcircuits 613 and 614 are commonly opened and closed in response to the logic state of the $\overline{-SW}$ control signal on lead 605. Diode 602 and phototransistor 623 together form a first opto-isolator, and diode 606 and phototransistor 628 form a second opto-isolator. The collectors of phototransistors 623 and 628 are commonly connected to node 630 and through resistor 625 to the supply $+V_S$. The base of phototransistor 623 is connected through resistor 624 to node 631, which is also connected to the base of phototransistor 628 through resistor 629. Node 631 is connected to the negative return $-V_S$. Resistor 632 connects the emitter of phototransistor 623 to node 631, and resistor 652 connects the emitter of phototransistor 628 to node 631. Zener diode 626 and capacitor 627 are connected in parallel between node 630 and node 631. As connected between $+V_S$ and $-V_S$, resistor 625, capacitor 627, and zener diode 626 provide a low-voltage bias supply for phototransistors 623 and 628. The emitter of phototransistor 623 is connected to the base of transistor 633. The collector of transistor 633 is connected to the base of transistor 636 in subcircuit 611, and the emitter of transistor 633 is connected through resistor 634 to the base of transistor 645 in subcircuit 612. The emitter of phototransistor 628 is connected to the base of transistor 653. The collector of transistor 653 is connected to subcircuit 613, and the emitter of transistor 653 is connected through resistor 654 to subcircuit 614.

When the $\overline{+SW}$ and $\overline{-SW}$ control signals are logical "1's", and leads 601 and 605 are at a positive potential, no current flows through LEDS 602 and 606; and phototransistors 623 and 628 remain off. Resistors 624 and 629 prevent leakage currents from turning on phototransistors 623 and 628, respectively. Resistors 632 and 652 prevent leakage currents from phototransistors 623 and 628, from turning on transistors 633 and 653, respectively. With transistor 633 off, transistors 635, 636, and 640 within subcircuit 611 are kept off. Resistor 638 prevents leakage currents from transistor 636 from turning transistor 635 on. Similarly, with transistor 633 off, transistors 645, 646, and 647 within subcircuit 612 are off; and resistor 651 prevents leakage currents from transistor 645 from turning transistor 646 on. With transistor 653 off, all transistors in subcircuits 613 and 614 are similarly off. With all transistors off, no paths are closed between outputs 619 and 621 and $+V_S$ and $-V_S$, and the output voltage $E_{12}$ is zero.

When $\overline{+SW}$ control signal switches to a logical "0", the potential on lead 601 falls below the potential of source 604, and current flows through LED 602. The light emitted by LED 602 is detected by phototransistor 623, which turns on. The voltage at node 630 across zener diode 626 thereupon appears at the base of transistor 633, forward biasing its base-emitter junction and turning it on. Transistors 635 and 636 in subcircuit 611, and transistors 645 and 646 in subcircuit 612, are thus also turned on. A first current path is thereby established through varistor 637 and the collector-emitter path of transistor 635 between $+V_S$ and output 619; and a second current path is established through varistor 655 and the collector-emitter path of transistor 646 between $-V_S$ and output 621. The output voltage $E_{12}$ then equals the positive supply voltage $+V_S$.

When the $\overline{+SW}$ control signal returns to the logical "1" state, current stops flowing through diode 602, and phototransistor 623 and transistor 633 turn off. Because of storage effects, however, transistors 635 and 636 do not immediately turn off. Transistor 640, resistor 641 and varistor 637 interact to effect a quick turn-off of transistor 635. During conduction, the base of transistor 635 is held at a voltage below $+V_S$ that is determined by the characteristic of varistor 637 and the base-emitter voltage of transistor 635. When transistor 633 turns off, resistor 641 pulls the bases of transistors 640 and 636 to $+V_S$. This turns transistor 636 off. Transistor 640, which had been off, conducts heavily as an emitter follower, and forces the base of transistor 635 to $+V_S$ minus this base-emitter voltage of transistor 640. The base-emitter junction of transistor 635 is then reversed biased and the transistor is quickly turned off. In a similar manner, transistor 647, resistor 650, and varistor 654 aid in the quick turn-off of transistors 645 and 646.

When transistors 635 and 646 turn off, the energy stored in the inductor in the output filter of the delta-modulation power amplifier is returned to the high-voltage supply through the diodes 656 and 657 in switching subcircuits 613 and 614, respectively.

Phototransistor 628, transistor 653, and switching subcircuits 613 and 614 function in an identical manner to the circuitry described hereinabove in response to logical "1" and logical "0" on $\overline{-SW}$ control signal.

Figure 7:
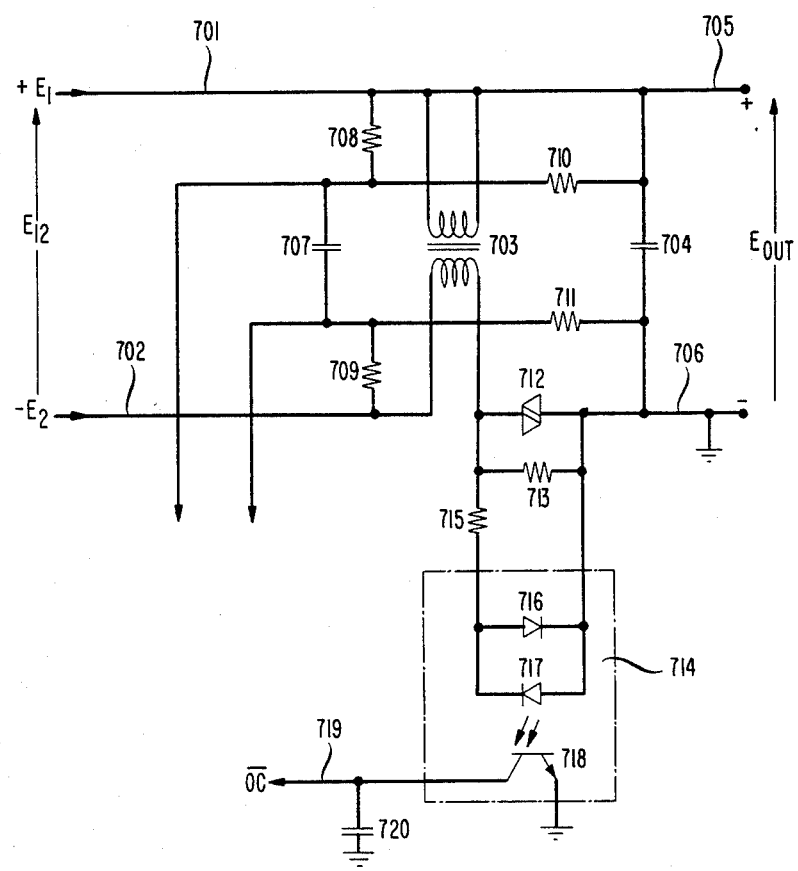
FIG. 7 is a schematic diagram of the low-pass output filter, current sensor, and feedback integrator circuits in FIG. 4.

With reference to the schematic diagram of the output filter, feedback integrator, and over-current sensor in FIG. 7, the output of the bridge switch is coupled to the filter circuitry over leads 701 and 702. The output filter includes balanced inductor 703 and capacitor 704. As a first order approximation, the filter functions to integrate the digital signal at the output of the bridge switch, as well as to filter the high-frequency components from that signal. The resultant output signal $E_{out}$ between lead 705 and grounded lead 706 is a smooth continuous amplified replica of the reference ringing signal applied to the input of the delta-modulation power amplifier.

As heretofore described, the feedback signal is derived from both the digital signal $E_{12}$ at the output of the bridge switch and the analog output signal $E_{out}$. The digital output $E_{12}$ of the bridge switch is applied to a balanced integrator consisting of capacitor 707 and resistors 708 and 709, which integrate $E_{12}$ to form a piecewise linearly reconstructed amplified input signal. A second component of that feedback signal is derived from the amplified analog output signal $E_{out}$. A portion of that signal is integrated by the integrator formed by resistors 710 and 711, and capacitor 707. As heretofore described, this signal component effects load regulation of the output signal $E_{out}$.

The current sensor circuitry includes a varistor 712 in series with the current path of inductor 703. Resistor 713 is connected across varistor 712, and opto-isolator 714 is connected in series with resistor 715 and across resistor 713. Opto-isolator 714 includes interconnected LEDs 716 and 717 and an emitter-grounded photosensitive transistor 718. When the voltage across resistor 713 reaches a level sufficient to force current conduction through either LED, the light emitted therefrom saturates phototransistor 718, and pulls its collector lead 719 to ground. The $\overline{OC}$ control signal on lead 719 is inputted to the over-current logic circuitry within the algorithm control logic circuit (FIG. 5). When the collector of transistor 718 is thus pulled to ground, the $\overline{OC}$ control signal becomes a logical "0"; and, as heretofore described, all switching elements in the bridge switch are immediately opened. Varistor 712 and resistor 715 function to limit the maximum current through LEDs 716 and 717 to prevent damage to these circuit elements. Capacitor 720, connected between lead 719 and ground, prevents noise spikes from the output filter from presetting the $\overline{P}$ inputs of flip-flops 524 and 525 in the algorithm control logic circuit in FIG. 5.

Although the delta-modulation power amplifier has been described hereinabove for use in a ringing signal generator, the same delta-modulation amplifier could find use in many other applications requiring linear power amplification.

The above-described embodiment is illustrative of the principles in applications of the present invention. Other embodiments may be devised by those skilled in the art without departing from the spirit and scope of the invention.

What is claimed is:

1. A ringing signal generator comprising
    means for receiving a low-level reference ringing signal,
    means for producing a binary error signal representing the polarity of the difference between said low-level reference ringing signal and a derived feedback signal,
    means for receiving clock pulses at a frequency substantially greater than said reference ringing signal,
    logic means for storing samples of said binary error signal at a plurality of said clock pulse instants and for producing at least one control signal from said stored error signal samples, said at least one control signal defining a unique logic state of plural-clock-pulse duration upon a change in binary error signal state, following a sample sequence of predetermined duration of samples in a single binary signal state,
    switching means for producing a high-level digital output signal in response to said at least one control signal, said output signal having a zero amplitude during said unique logic state,
    feedback means for deriving said feedback signal from said high-level digital output signal, and
    output means for filtering high-frequency components from said high-level digital output signal to produce said ringing signal.

2. A ringing signal generator in accordance with claim 1 wherein said binary error signal varies between a logical "1" state and a logical "0" state, and said logic means comprises storge means for storing the logical state of said binary error signal at a plurality of said clock pulse instants, and means for producing first and second control signals having logic states determined by said stored logic states of said binary error signal, said switching means producing said high-level digital output signal at a first voltage in response to one logic state of said first binary control signal and said high-level digital output signal at a second voltage in response to one logic state of said second binary control signal, said switching means producing said high-level digital output signal at a zero voltage in response to time coincidence of the complement of said one logic state of said first binary control signal and the complement of said one logic state of said second binary control signal.

3. A ringing signal generator in accordance with claim 2 wherein said output means includes means for detecting an over-current condition, and said logic means produces said first binary control signal at the complement of said one logic state and said second binary control signal at the complement of said one logic state in response to said over-current condition.

4. A ringing signal generator in accordance with claim 2 wherein said means for producing said first and second binary control signals comprises
    a polarity flip-flop having set and reset inputs and first and second logically complementary outputs,
    means for setting said polarity flip-flop when all of said stored logic states are at a first logic state,
    means for resetting said polarity flip-flop when all of said stored logic states are at the complement of said first logic state,
    means for producing said first binary control signal at said one logic state only when said polarity flip-flop is set and a predetermined number of the most recently stored logic states are at said first logic state, and for producing said first binary control signal at the complement of said one logic state otherwise,
    means for producing said second binary control signal at said one logic state only when said polarity flip-flop is reset and a predetermined number of the most recently stored logic states are at said second logic state, and for producing said second binary control signal at the complement of said one logic state otherwise.

5. A ringing signal generator in accordance with claim 2 wherein said logic means further comprises means to prevent the simultaneous occurrence of said first binary control signal at said one logic state and said second binary control signal at said one logic state.

6. A ringing signal generator in accordance with claim 5 wherein said logic means produces said first binary control signal at said complementary logic state and said second binary control signal at said complementary logic state to produce a zero voltage high-level digital output signal for a predetermined time interval during each transition of said high-level digital output signal between said first and second voltages.

7. A ringing signal generator in accordance with claim 6 wherein said first and second voltage outputs of said switching means are equal in magnitude and reversed in polarity.

8. A ringing signal generator in accordance with claim 7 wherein said switching means comprises
   a DC voltage source having a positive supply and negative return,
   first and second output terminals,
   first switching circuit means connecting between said positive supply and said first output terminal,
   second switching circuit means connected between said negative return and said second output terminal,
   third switching circuit means connected between said positive supply and said second output terminal,
   fourth switching circuit means connected between said negative return and said first output terminal,
   first opto-isolator means responsive to the logic state of said first binary control signal for controlling the opening and closing of said first and second switching circuit means, and
   second opto-isolator means responsive to the logic state of said second binary control signal for controlling the opening and closing of said third and fourth switching circuit means.

9. A ringing signal generator in accordance with claim 1 wherein said feedback means comprises integrating means for integrating said high-level digital output signal, and attenuating means for attenuating said integrated high-level digital output signal by a factor of $\beta$ ($\beta<1$), wherein the voltage gain between said output ringing signal and said reference ringing signal is approximately equal to $1/\beta$.

10. A ringing signal generator in accordance with claim 9 wherein a portion of said output ringing signal is fed back through said feedback means to provide output load regulation.

11. A delta-modulation power amplifier for linearly amplifying a low amplitude input signal comprising
    means for producing a binary error signal representing the polarity of the difference between said input signal and a derived feedback signal,
    means for receiving clock pulses at a frequency substantially greater than the frequency of said input signal,
    logic means for storing samples of said binary error signal at a plurality of said clock pulse instants and for producing at least one control signal from said stored error signal samples,
    switching means for producing a high-level digital output signal at an amplitude greater than that of said input signal in response to said at least one control signal,
    feedback means for deriving said feedback signal from said high-level digital output signal, and
    output means for filtering high-frequency components from said high-level digital output signal to produce a correspondingly high amplitude replica of said low amplitude input signal.

12. A delta-modulation power amplifier in accordance with claim 11 wherein said binary error signal varies between a logical "1" state and a logical "0" state, and said logic means comprises storage means for storing the logical state of said binary error signal at a plurality of said clock pulse instants, and means for producing first and second binary control signals having logic states determined by said stored logic states of said binary error signal, said switching means producing said high-level digital output signal at a first voltage in response to one logic state of said first binary control signal and said high-level digital output signal at a second voltage in response to one logic state of said second binary control signal, said switching means producing said high-level digital output signal at a zero voltage in response to the complement of said one logic state of said first binary control signal and the complement of said one logic state of said second binary control signal.

13. A delta-modulation power amplifier in accordance with claim 12 wherein said output means includes means for detecting an over-current condition, and said logic means produces said first binary control signal at the complement of said one logic state and said second binary control signal at the complement of said one logic state in response to said over-current condition.

14. A delta-modulation power amplifier in accordance with claim 13 wherein said means for producing said first and second binary control signals comprises
    a polarity flip-flop having set and reset inputs and first and second logically complementary outputs,
    means for setting said polarity flip-flop when all of said stored logic states are at a first logic state,
    means for resetting said polarity flip-flop when all of said stored logic states are at the complement of said first logic state,
    means for producing said first binary control signal at said one logic state only when said polarity flip-flop is set, and for producing said first binary control signal at the complement of said one logic state otherwise,
    means for producing said second binary control signal at said one logic state only when said polarity flip-flop is reset and a predetermined number of the most recently stored logic states are at said second logic state, and for producing said second binary control signal at the complement of said one logic state otherwise.

15. A delta-modulation power amplifier in accordance with claim 12 wherein said logic means further comprises means to prevent the simultaneous occurrence of said first binary control signal at said one logic state and said second binary control signal at said one logic state.

16. A delta-modulation power amplifier in accordance with claim 15 wherein said logic means produces said first binary control signal at said complementary logic state and said second binary control signal at said complementary logic state to produce a zero voltage high-level digital output signal for a predetermined time interval during each transition of said high-level digital output signal between said first and second voltages.

17. A delta-modulation power amplifier in accordance with claim 16 wherein said first and second voltage outputs of said switching means are equal in magnitude and reversed in polarity.

18. A delta-modulation power amplifier in accordance with claim 17 wherein said switching means comprises
    a DC voltage source having a positive supply and negative return, first and second output terminals, first switching circuit means connecting between said positive supply and said first output terminal, second switching circuit means connected between said negative return and said second output terminal, third switching circuit means connected between said positive supply and said second output terminal, fourth switching circuit means connected between said negative return and said first output terminal, first opto-isolator means responsive to the logic state of said first binary control signal for controlling the opening and closing of said first and second switching circuit means, and second opto-isolator means responsive to the logic state of said second binary control signal for controlling the opening and closing of said third and fourth switching circuit means.

19. A delta-modulation power amplifier in accordance with claim 11 wherein said feedback means comprises integrating means for integrating said high-level digital output signal, and attenuating means for attenuating said integrated high-level digital output signal by a factor of $\beta$ ($\beta < 1$), wherein the voltage gain between said amplified output signal and said input signal is approximately equal to $1/\beta$.

20. A delta-modulation power amplifier in accordance with claim 19 wherein a portion of said amplified output signal is fed back through said feedback means to provide output load regulation.

21. A method for linearly amplifying an analog reference signal of variable amplitude, said method comprising the steps of developing an indicator signal having binary magnitudes which are indicative of the direction of amplitude variation in said reference signal, generating, in response to said indicator signal, a control signal having different logic states including, at each indicator signal binary magnitude transition, a unique logic state of predetermined duration and different from logic states otherwise produced in response to said indicator signal, selecting, in response to said different logic states, other than said unique logic state, one or the other of two polarities of a voltage supply having at either polarity magnitude substantially greater than any magnitude of said reference signal, and selecting, in response to said unique logic state, neither of said two polarities, and filtering an output of said selecting step to integrate such output and remove high-frequency components therefrom.

22. A method for amplifying an analog reference signal of variable amplitude, said method comprising the steps of developing at a voltage substantially higher than voltages of said reference signal a digital delta-modulation representation of said reference signal, said developing step including the steps of comparing said reference signal to a feedback signal to develop a binary error signal, selecting a first or a second polarity of a high voltage in response to first and second states of said error signal, and feeding back from said high voltage delta-modulation representation of said comparing step said feedback signal at a frequency approximately that of said reference signal and which is representative of amplitude variations in said high voltage delta-modulation representation, and filtering high frequencies from said delta-modulation representation to produce an analog output signal which is a high voltage replica of said reference signal.

23. The reference signal amplifying method in accordance with claim 22 in which said feeding back step includes the step of additionally feeding back to said comparing step a signal representative of amplitude variations in said analog output signal.

* * * * *

UNITED STATES PATENT AND TRADEMARK OFFICE
CERTIFICATE OF CORRECTION

PATENT NO. : 4,500,844
DATED : February 19, 1985
INVENTOR(S) : Richard J. Lisco

It is certified that error appears in the above—identified patent and that said Letters Patent is hereby corrected as shown below:

In the Detailed Description, column 9, line 62, "$\overline{A_A}$" should read --$\overline{Q_A}$--; line 66, "$A_A$" should read --$Q_A$-- Column 18, line 6, "polarity" should read --polarity a--.

Signed and Sealed this

Fifteenth Day of October 1985

[SEAL]

Attest:

DONALD J. QUIGG

Attesting Officer

Commissioner of Patents and
Trademarks—Designate